United States Patent
Cunningham

(10) Patent No.: US 6,434,180 B1
(45) Date of Patent: Aug. 13, 2002

(54) VERTICAL CAVITY SURFACE EMITTING LASER (VCSEL)

(75) Inventor: John E Cunningham, Lincroft, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 52 days.

(21) Appl. No.: 09/740,446

(22) Filed: Dec. 19, 2000

(51) Int. Cl.[7] .......................... H01S 5/183; H01S 5/40; H01S 3/08; H01S 3/091
(52) U.S. Cl. ............................. 372/50; 372/75; 372/96
(58) Field of Search ........................... 372/50, 96, 45, 372/46, 75

(56) References Cited

U.S. PATENT DOCUMENTS

| | | | | |
|---|---|---|---|---|
| 5,513,202 A | * | 4/1996 | Kobayashi et al. ............ | 372/96 |
| 5,513,204 A | * | 4/1996 | Jayaraman .................... | 372/96 |
| 5,754,578 A | * | 5/1998 | Jayaraman .................... | 372/50 |
| 5,914,976 A | * | 6/1999 | Jayaraman et al. ............ | 372/50 |
| 6,252,896 B1 | * | 6/2001 | Tan et al. ..................... | 372/50 |

FOREIGN PATENT DOCUMENTS

| | | | | |
|---|---|---|---|---|
| GB | 2342773 A | * | 4/2000 | ............. H01S/5/40 |
| WO | WO-00/62384 | * | 10/2000 | ........... H01S/5/183 |

\* cited by examiner

*Primary Examiner*—Quyen Leung
(74) *Attorney, Agent, or Firm*—Arthur J. Torsiglieri

(57) ABSTRACT

A vertical cavity surface emitting laser emitting at about 1.3 microns while being optically pumped by a vertical cavity surface emitting laser emitting at about 810 nanometers characterized in that the resonant cavities of the two lasers are coupled to increase the effectiveness of the pumping light to stimulate emission from the gain medium of the long-wavelength medium. The two lasers are formed in a multilayer stack of which all the layers are epitaxial except for the layers at the top of the stack that serve as a broad band output mirror and the upper bounding of the long wavelength laser.

6 Claims, 4 Drawing Sheets

VERTICAL CAVITY SURFACE EMITTING LASER (VCSEL)

FIELD OF THE INVENTION

This invention relates to semiconductor lasers and more particularly to a vertical cavity surface emitting laser (VCSEL).

BACKGROUND OF THE INVENTION

A VCSEL is a semiconductor laser that comprises a multilayer semiconductive element that includes semiconductive layers that serve as the gain medium sandwiched between reflective mirrors, desirably distributed Bragg reflective layers, that form a cavity resonant at the optical wavelength desired for the laser for providing a standard wave, at a single fundamental mode, in a direction vertical to the layers. Such light can be readily coupled to an optical fiber for utilization. For efficiency, the mirrors should have reflectivity in excess of about 99.5 percent. Such high reflectivity mirrors are difficult to grow in the same epitaxial process used to grow the grain medium in long-wavelength lasers, for example at 1300 or 1500 nanometers, wavelengths important for use in optical fiber transmission systems. Accordingly, VCSELs designed for operation at long wavelengths typically have used for the mirrors either evaporated layers of dielectric material or of lattice mismatched semiconductors. Mirrors of this kind make difficult the electrical injection of charge carriers into the gain medium, the usual manner of creating the population inversion in the gain medium necessary to achieve the desired stimulated emission of radiation critical to laser operation.

To avoid this problem, there have been proposals to provide the necessary population inversion in the gain medium by optical pumping at a shorter wavelength. In such a VCSEL, there are provided a pair of cavities. The first is tuned to the desired long wavelength and includes a first medium suitable for being optically pumped at a shorter wavelength to provide light at the longer wavelength. The second cavity is tuned to the shorter wavelength and includes a medium for lasing at the shorter wavelength by the electrical injection of charge carriers, thereby providing light for optically pumping the first gain medium.

Long-wavelength optically pumped lasers of this kind have been described in U.S. Pat. No. 5,754,578 that issued on May 19, 1998. In a first arrangement described, in which the short wavelength cavity is superposed on the long wavelength cavity, the short wavelength radiation is emitted from the bottom surface of the short wavelength laser and transmitted through the top surface of the underlying long wavelength gain medium and the desired long wavelength radiation typically exits from the bottom surface of the long wavelength cavity.

In a first exemplary embodiment of this first arrangement, all the layers used to provide the mirrors in both cavities are made from the GaAs/AIGaAs system and the fabrication employs two wafer fusion steps.

In a second exemplary embodiment of this first arrangement, the bottom long wavelength mirror of the long wavelength VCSEL is fabricated from either the InP/InGaAsP system or the InP/InGa AIAs system and is grown in the same epitaxial step as the long-wavelength gain medium. The upper mirror, which is grown in the same epitaxial step as the short-wavelength VCSEL, is attached to the long-wavelength gain medium by wafer fusion. The remaining mirrors of the long-wavelength VCSEL and the short wavelength VCSEL are fabricated from the GaAs/AIGa As system.

In a third exemplary embodiment of the first arrangement, the long-wavelength mirror is attached to an upper GaAs/AIGaAs mirror by metal bonding; and the other long-wavelength mirror is either an epitaxially-grown InP/InGaAsP or InP/InGaAIAs mirror, a wafer-fused GaAs/AIGaAs mirror or a metal-bonded GaAs/AIGaAs mirror.

In a second arrangement, short wavelength light emitted from the top surface of an underlying short wavelength VCSEL is transmitted through the lower mirror of the long-wavelength VCSEL. The lower mirror of the long-wavelength VCSEL is grown in the same epitaxial step as the upper mirror of the short-wavelength gain medium VCSEL and is fabricated from the GaAs/AIGaAs system.

In an exemplary embodiment of the second arrangement, all the mirrors in the structure are from the GaAs/AIGaAs system, except for the top mirror of the long wavelength VCSEL. The top mirror of the long wavelength VCSEL is either (1) a wafer-fused GaAs/AIGaAs mirror, (2) an epitaxially-grown InP/InGaAsP or In P/InGaAIAs mirror, or (3) a sputtered or evaporated dielectric mirror. Any of these three mirrors can be supplemented with a metal reflector at the top of the stack to increase reflectivity.

It is characteristic of the various structures described in such prior art that the long-wavelength cavity includes an outer reflective boundary that is tuned to be highly reflective selectively at the long wavelength that is to be emitted as the output. There is no attempt made to establish in the cavity of the long wavelength cavity resonant conditions at the shorter wavelength so that a standing wave of the shorter wavelength is established in the cavity of the long-wavelength laser.

In these structures, each cavity is essentially independent of the other, and is designed to confine the electric field of the emitted light essentially entirely within its boundaries and to peak it within the gain medium included in its cavity. As a consequence this tends to limit the efficiency of the short wavelength light pumping process.

Additionally in the prior art structures, no attempt had been made to form all but the upper reflective mirrors as layers grown epitaxially on a monocrystaline substrate to make feasible a relatively thick gain medium in the long-wavelength VCSEL.

SUMMARY OF THE INVENTION

The present invention seeks to improve a long-wavelength VCSEL of the kind in which the long-wavelength VCSEL is optically pumped by a short-wavelength VCSEL, by improving the efficiency of the conversion of the short-wavelength pumping light to long-wavelength output light by changes in the optical structure that make possible efficient use of a thicker gain medium. Basically this is done by a cavity design that effectively couples together the cavities of the two VCSELs such that the electric field of the pumping light emitted by the short-wavelength VCSEL extends at significant strength beyond the cavity of the short-wavelength VCSEL and into the gain medium of the long-wavelength VCSEL.

This is done by stacking together on a common substrate the long-wavelength laser supported over the short-wavelength laser and designing the outer mirror of the long-wavelength laser cavity to cooperate with the inner mirror of the short-wavelength mirror to provide constructive buildup of the electric field of the short-wavelength laser in the long-wavelength laser cavity. To this end, the outer mirror of the long-wavelength laser cavity is a broad band mirror that is highly reflective of both the short- and the long-wavelength light involved in the device and is designed to establish a standing wave of the short-wavelength light in the cavity of the long-wavelength laser.

In an exemplary embodiment, a VCSEL designed to emit output light of a long wavelength, typically 1.3 μm, comprises a single crystal substrate, on top of which are stacked a plurality of monocrystalline semiconductive layers, advantageously all grown by molecular beam epitaxy, topped by a dielectric mirror that forms an essentially monolithic structure free of fused layers. These multilayers form a first lower VCSEL, designed to use electrical pumping and to lase at the shorter wavelength and to optically pump the second upper laser that is to provide the longer-wavelength light that is to be the output.

The multilayers of the stack that form the first VCSEL typically comprise a first section that forms a mirror that is highly reflective of the shorter wavelength light, a second section that forms the cavity including the gain medium for such light, and a third section that forms a mirror that is both sufficiently reflective of the short-wavelength light to establish lasing in such gain medium and sufficiently transmissive to permit laser light of the short wavelength to penetrate into the second VCSEL. The first and third sections serve as reflective boundaries of a cavity resonant at the shorter wavelength, as in a conventional VCSEL.

The layers of the stack that form the second VCSEL comprise a fourth section that forms a mirror that is both sufficiently reflective of the long wavelength light to support lasing at the long wavelength and sufficiently transmissive of the short-wavelength light to provide optical pumping of the second VCSEL. The fifth section forms the cavity that includes the gain medium of the long-wavelength laser and is advantageously wider than it would normally be so that it can include a plurality of quantum wells. The sixth section forms a mirror with the fourth section boundaries of a cavity resonant at the long wavelength and with the mirror of the first section boundaries of a cavity resonant at the short wavelength. Accordingly the sixth section needs to be highly reflective at both the short and long wavelengths. It also needs to be sufficiently transmissive of the long wavelength to provide a useful output.

In the preferred embodiment, the device is formed largely as a stack of the first five sections as layers epitaxially grown on a semi-insulating substrate, such as insulating monocrystalline GaAs. On this substrate is first formed the outer mirror of the short-wavelength VCSEL by a series of quarter short-wavelength layers alternately of the AlAs and AlGaAs to form a distributed Bragg reflector (DBR). Next there is formed the cavity of the short-wavelength laser as a layer of GaAs in which is formed a P-I-N diode. Next there is formed the second or inner mirror of the short-wavelength VCSEL, also by a succession of one-quarter wavelength short-wavelength layers, alternately of AlAs and AlGaAs to form a DBR. This marks the end of the short-wavelength laser. Next there follows a succession of one-quarter long-wavelength layers alternately of AlAs and GaAs to form the inner DBR mirror of the long-wavelength cavity followed by layers that form the long-wavelength AlGaAs cavity, sufficiently wide to include at least two layers of GaAsSb and GaAs that form the quantum wells that serve as the gain medium for the long wavelength VCSEL. Finally, as the outer mirror of the long-wavelength VCSEL there is deposited a plurality of dielectric layers, alternately of $S_iO_2$ and $T_iO_2$ to form a broad band mirror highly reflective of both the short and long wavelength.

In particular, distance separating the inner mirror of the short-wavelength VCSEL and the outer mirror of the long-wavelength VCSEL is such as to establish a standing wave of the short-wavelength therebetween.

The invention will be better understood from the following more detailed description taken in conjunction with the accompanying drawing.

DETAILED DESCRIPTION

Figure 1:
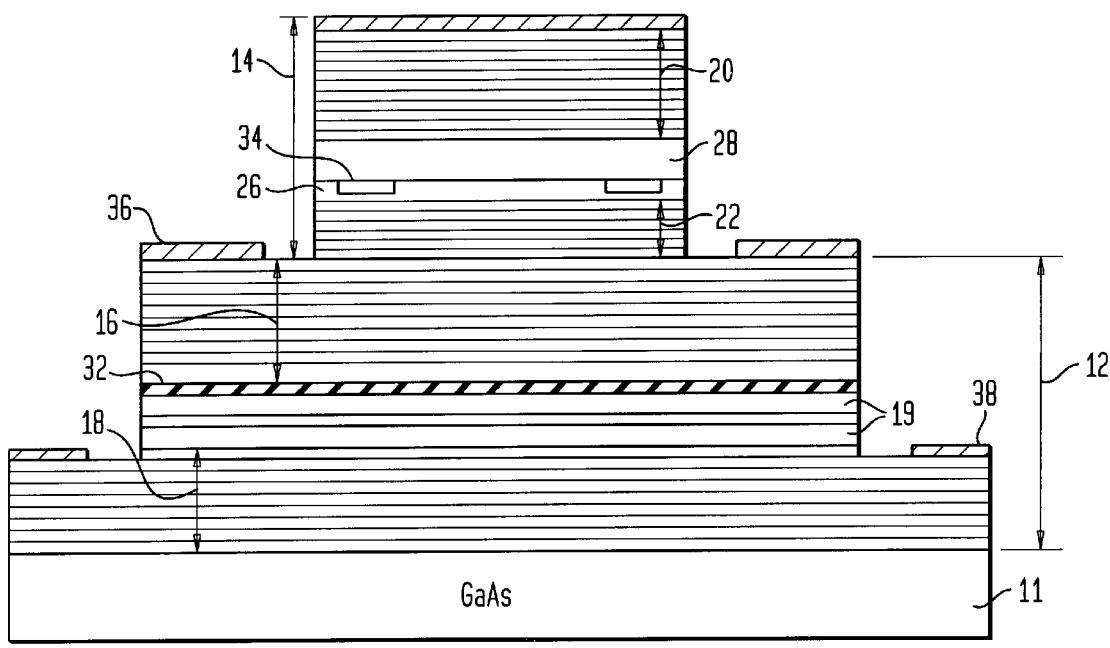
FIG. 1 shows the basic structure of long-wavelength VCSEL pumped optically by a short-wavelength VCSEL in accordance with the prior art.

In FIG. 1 there is shown a VCSEL laser 10 of the kind described in the earlier mentioned U.S. Pat. No. 5,754,578.

It comprises a semi-insulating GaAs substrate 11 on which has been grown a stack of layers that form a lower short-wavelength VCSEL 12 that optically pumps an upper long-wavelength VCSEL 14. The short-wavelength laser 12 includes a top (inner) DBR mirror 16, a bottom (outer) mirror DBR 18, and bounding a cavity 19 including its short-wavelength gain medium. In typical fashion to this end the cavity includes p-type and n-type layers sandwiching a lightly doped region to form a p-i-n diode. Typically to maintain laser action, both mirrors 18 and 19 need to be highly reflective, typically more than 99 percent reflective. The long-wavelength VCSEL 14 includes a top (outer) mirror 20, a bottom (inner) mirror 22, and a cavity 28 including the gain medium. The top long-wavelength mirror 20 can be either (1) a wafer4used or metal-bonded GaAs/AlGaAs DBR mirror, (2) a DBR epitaxially-grown InP/InGaAsP or InP/InGa AlAs mirror; or (3) a sputtered or evaporated dielectric mirror. Any of these three mirror designs optionally includes a metal reflector 24 at the top to the stack to increase reflectivity. The bottom mirror of the long-wavelength VCSEL 14 is advantageously grown in the same epitaxial growth step as the short-wavelength VCSEL, generally by molecular beam epitaxy.

A wafer-fused interface 26 is included between the long wavelength gain cavity 28 and the bottom long-wavelength mirror 22 because of the lattice mismatched. The long wavelength gain cavity 28 typically consists of materials selected from the group consisting of InP, InGaAsP, and InGaAlAs. In typical fashion the gain medium includes a quantum well to provide the gain. Generally the practice has been to insert at most three quantum wells. The concentration of the holes and electrons injected from opposite sides of the junction falls off sharply with distance so that wide intrinsic junction regions become inefficient.

Current confinement is obtained in the short-wavelength VCSEL 12 by lateral oxidation using AlGaO layer 32. The long-wavelength VCSEL 14 is index-guided by etching grooves 34 prior to the wafer fusion of the bottom long-wavelength 22 and the long-wavelength cavity medium 28.

The short-wavelength VCSEL 12 is top-emittihg, emitting most of its power away from the substrate 10, while the long-wavelength VCSEL 14 can be either top-emitting or bottom-emitting. In the latter case, the VCSEL 12 and the substrate 11 need to be transparent to such light. Both p-type and n-type conductive contacts 36, 38 for electrical pumping of the short-wavelength VCSEL 12 are made below the long-wavelength VCSEL 14.

Figure 2A:
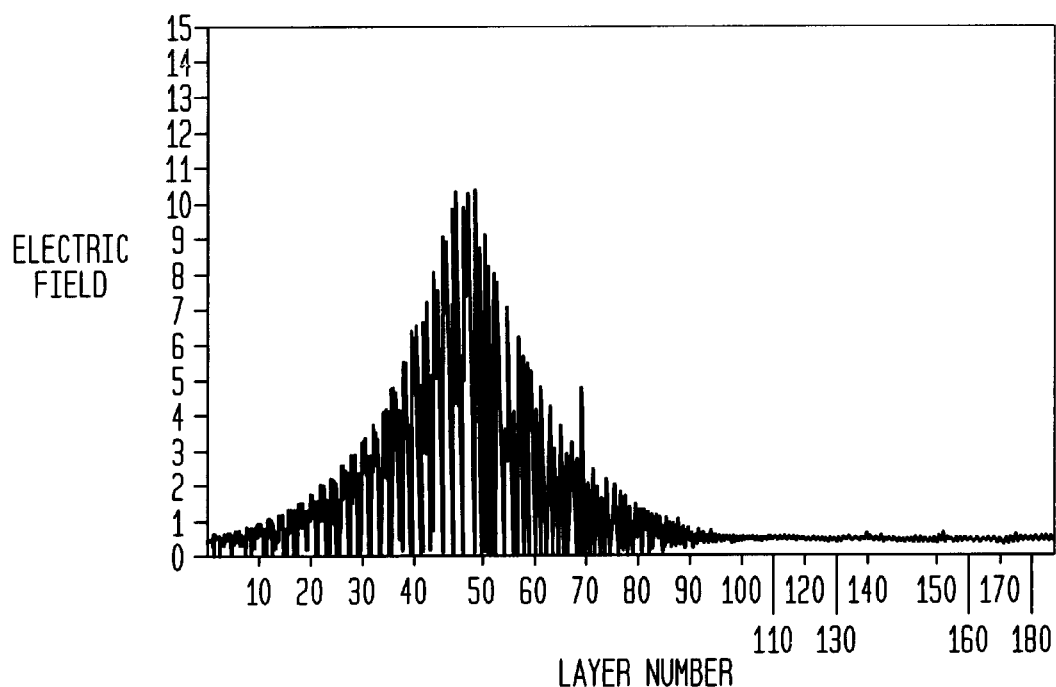
FIGS. 2A–2B show the electric field distribution within the separate cavities of the two lasers of FIG. 1.
Figure 2B:
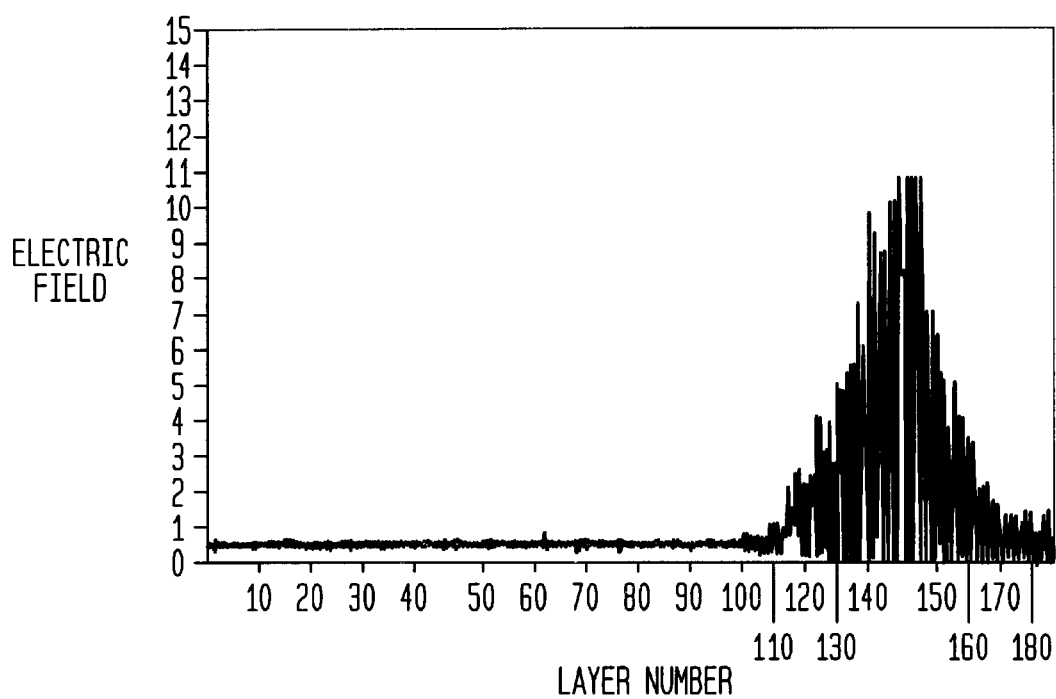

When lasing, the electric field distribution that is created along a vertical section between the top and bottom layers of the stack is shown, for the long-wavelength light in FIG. 2A, and for the short-wavelength light in FIG. 2B.

As is seen in FIG. 2A, the long-wavelength electric field peaks sharply in the layers of the stack that correspond to the relatively narrow long-wavelength cavity 28 and is essentially confined within the layers 20 and 22 that form the two DBR mirrors defining the reflective boundaries of the long-wavelength cavity.

As is seen in FIG. 2B, the short-wavelength electric field peaks sharply in the layers near the bottom of the stack that correspond to the short-wavelength cavity and is essentially confined by the layers that form the two mirrors 16 and 18 defining the reflective boundaries of the short-wavelength cavity 12.

As is seen from the two plots, in the laser of FIG. 1 there is essentially no coupling between the two cavities and the field distribution in each VCSEL would remain essentially as shown even if its two component VCSELs were physically separated.

Figure 3A:
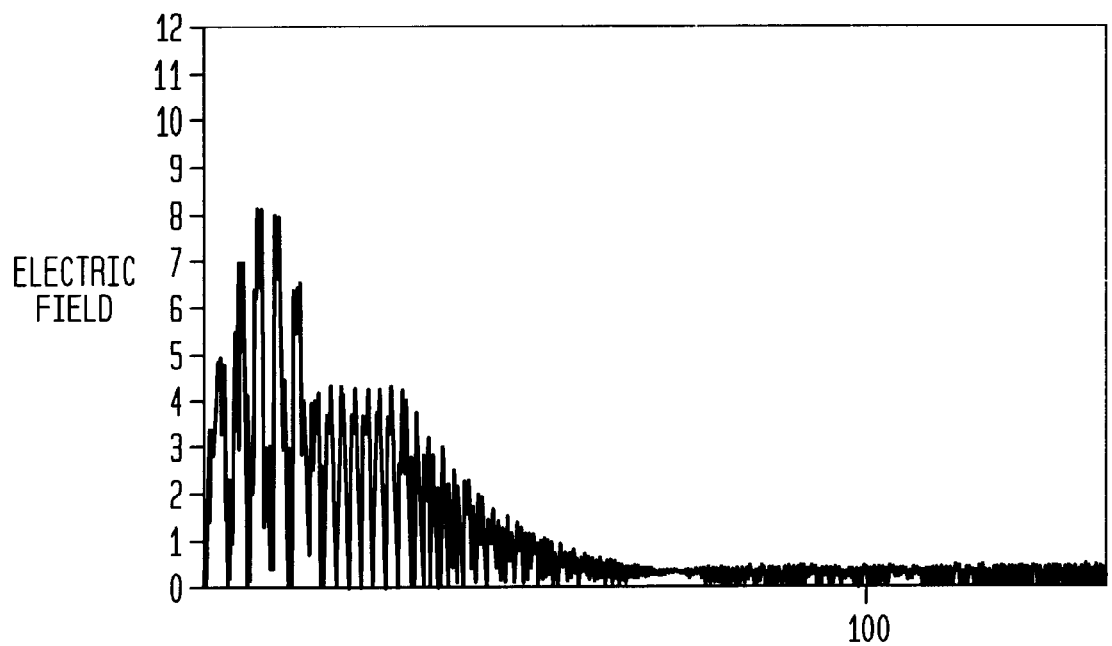
FIGS. 3A–3B show the electric field distribution with the two coupled cavities of the VCSEL of FIG. 4.
Figure 3B:
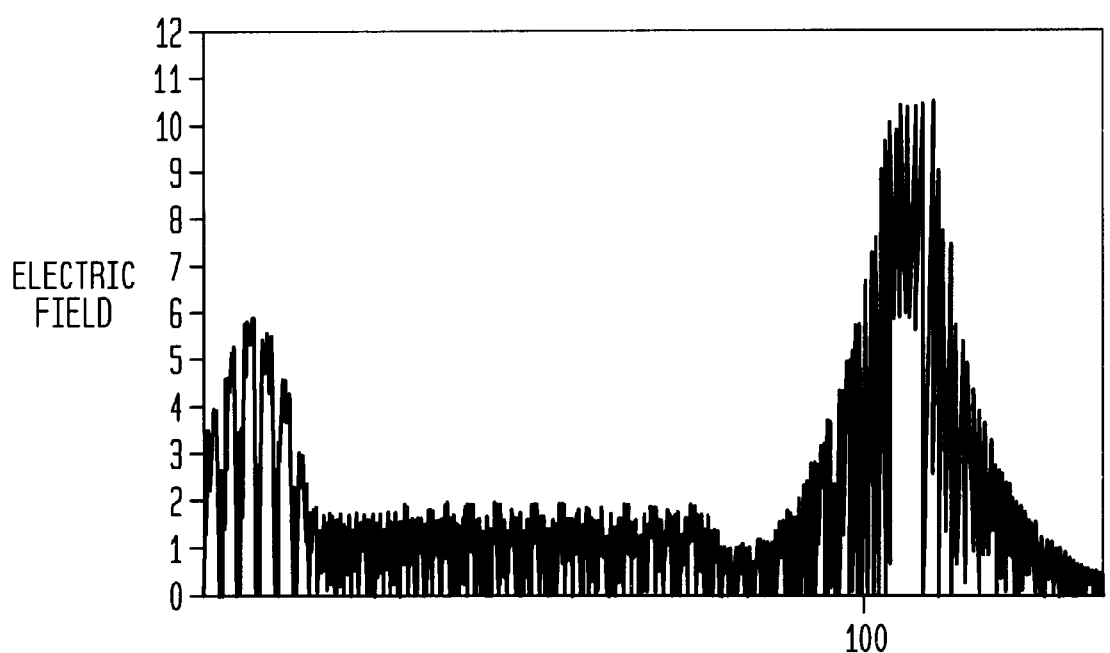
Figure 4:
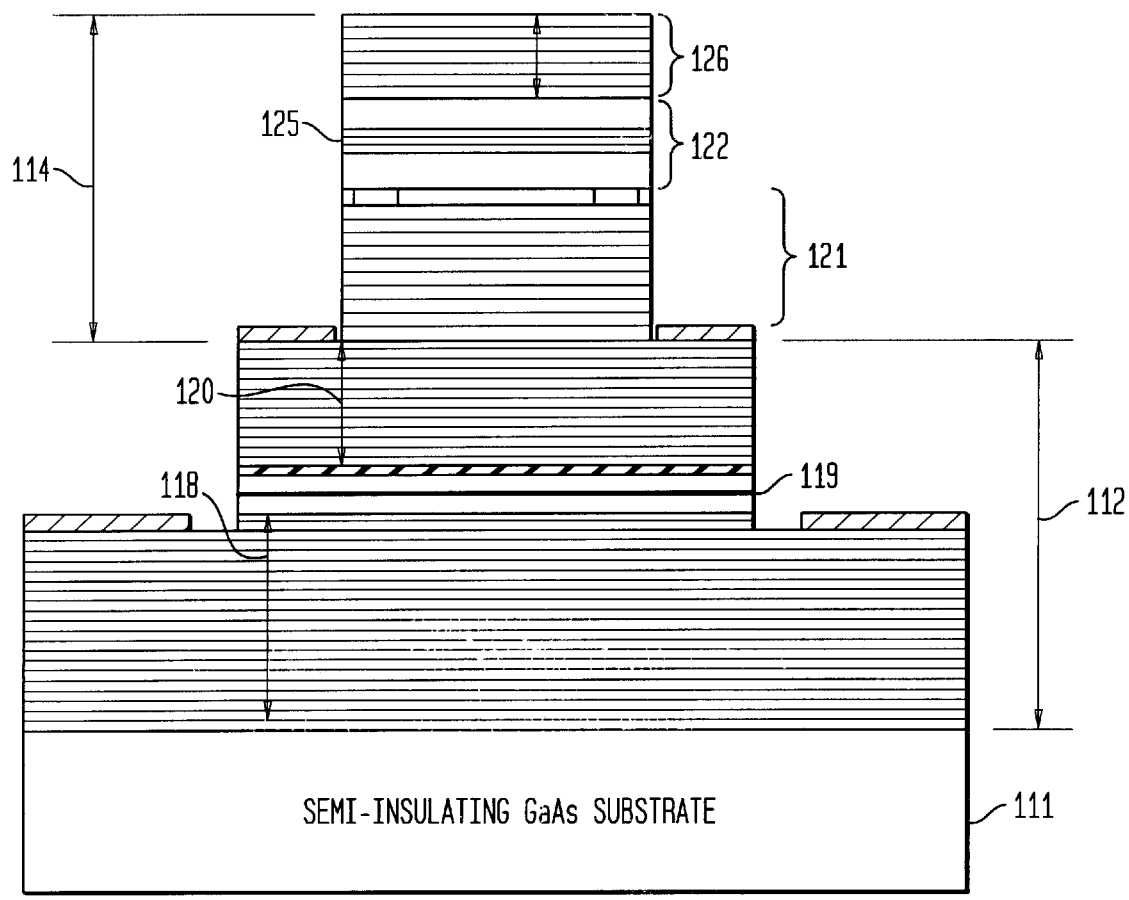
FIG. 4 shows the basic structure of a long-wavelength VCSEL pumped optically by a short-wavelength VCSEL in accordance with an exemplary embodiment of the invention.

FIG. 3A and FIG. 3B are comparable plots of the electric fields desired for the long-wavelength light and short-wavelength light, respectively, in a VCSEL laser in accordance with the present invention, for example as shown in FIG. 4.

As is seen in FIG. 3A, the electric field for the long-wavelength radiation peaks close to the top surface of the stack in the dielectric mirror, but maintains a relatively high uniform strength throughout the relatively longer long-wavelength gain medium, and tapers off to a uniformly relatively low strength through the short-wavelength VCSEL portion of the stack.

As seen in FIG. 3B, the short wavelength field maintains a steady strength at a moderate level through the entire stack portion including the long-wavelength gain medium for continually interacting with the long-wavelength field and forms a peak in the dielective mirror at the top of the stack, albeit at a lower level than its peak in the gain medium region of the short wavelength portion of the stack. This results because in the invention the upper mirror of the short wavelength VCSEL used to provide the pumping light can be more transmissive than in the prior art device because part of the transmitted light is reflected back by the upper mirror of the long wavelength VCSEL as a standing wave is established between these two mirrors as will be discussed in more detail subsequently.

In FIG. 4, there is shown a VCSEL in accordance with the invention constructed to provide electric fields of the kind shown in FIGS. 3A and 3B.

FIG. 4 shows a structure 110 that includes a long-wavelength VCSEL 114 that is optically pumped up by a short-wavelength VCSEL 112 in accordance with the invention. It includes a substrate 111 typically of high resistivity gallium arsenide, on which there has been grown epitaxially a stack that includes the first five sections of a stack similar in several respects to the stack shown in the device of FIG. 1. In particular, it includes a first section 118 that forms a DBR outer mirror of the VCSEL 112 and is designed to be highly reflective of the short-wavelength light produced by the VCSEL 112. The DBR comprises quarter wavelength layers alternately of low and high indices of refraction, for example, AlAs and AlGaAs.

It further includes a second section 119 that forms the cavity including the gain medium of the short-wavelength VCSEL 112 and includes p-type and n-type layers sandwiching a relatively thicker high-resistivity layer to form a p-i-n diode. The gain medium, for example, may be of AlGaAs, appropriately doped to form a p-i-n diode and containing at least three 80 Angstroms GaAs quantum wells.

The third section 120 is also a DBR mirror that needs to be sufficiently reflective of the short wavelength light to support laser operation but also can be more transmissive than typical of prior art devices, for example, more than one percent and as much as two percent transmissive, because part of the light will be returned after reflection from the outer mirror of the long wavelength VCSEL as a standing wave is established between these two mirrors. This higher transmissivity will permit more pumping light to be introduced into the long wavelength cavity where it can be converted to long wavelength radiation. This also can comprise alternate layers of aluminum arsenide and aluminum gallium arsenide.

The fourth section 121 also includes a plurality of quarter-wavelength layers of the longer wavelength of the VCSEL 114 alternately of high and low indices of refraction, for example AlGa and GaAs, to form a DBR mirror that is highly reflective of light of the longer wavelength and highly transmissive of the short-wavelength light from VCSEL 112 that is to pump VCSEL 114.

The fifth section 122 comprises the cavity that includes the gain medium 125 of the long-wavelength VCSEL 114. It is important to grow this layer epitaxially without undue strain and that it be sufficiently thick to accommodate at least several quantum wells to permit extended interaction of the pumping light with the gain medium. This section advantageously should be substantially thicker than that of the cavity enclosing the gain medium that would be used in prior art devices of the kind shown in FIG. 1, the latter will typically include a cavity gain medium sufficiently thick and to support without undue strain no more than two quantum wells. This is the case because the relative inefficiency of the conversion characteristics of such prior art device makes pointless providing more quantum wells.

Because of the stronger field of the pumping light in the gain medium of the long-wavelength VCSEL being described, it becomes feasible to include a number of quantum wells, and preferably at least six, in the gain medium 125. By using AlGaAs as the cavity matrix for quantum wells of GaAsSb and GaAs, it becomes feasible to introduce as many as six quantum wells in a cavity thickness of two long wavelengths, about 7200 Angstroms, without excessive strain or defects in the resulting monocrystalline lattice. Alternatively, the gain medium could be introduced into the AlGaAs matrix by quantum dots or layers of InGaAsN.

Finally, as a sixth section 126, there is deposited alternate layers of $S_iO_2$ and $T_iO_2$ to form the outer mirror 120 of the long-wavelength cavity. As discussed previously, this mirror 126 needs to be highly reflective both of the long and short wavelengths, as well as being sufficiently transmissive of the long-wavelength light to provide useful output power at the long-wavelength. Moreover this mirror 126 needs to be appropriately spaced to provide constructive interference with the inner mirror 120 of the short-wavelength VCSEL 112 that there is established between these two mirrors essentially a standing wave of the short-wavelength light to increase the efficiency of the pumping light to generate output light of the long wavelength. Optionally there may be included a top metallic layer to increase the reflectivity at both the long- and short-wavelengths.

In an examplary design the substrate monocrystalline gallium arsenide, the first section consisted of 22 quarter wavelength pairs of n-type aluminum arsenide and aluminum gallium arsenide, respectively about 711 Angstroms and 610 Angstroms in thickness, followed by a last quarter wavelength layer of aluminum arsenide. The second section cavity consisted of an n-type layer of AlGaAs followed by at least three quantum wells formed by alternating pairs of 80 Angstroms thick undoped gallium arsenide and 50 Angstroms thick undoped aluminum gallium arsenide, and the p-type doped layer 1000 Angstroms thick of aluminium gallium arsenide.

The third section was similar to the final section except that there are only 18 periods to provide for transmission therethrough of short-wavelength light to pump the long-wavelength VCSEL.

The fourth section included 20 pairs of 1100 Angstrom thick layers of aluminium arsenide and 900 Angstroms thick layer of gallium arsenide.

The fifth section includes three layers of 1400 thick layers of aluminium gallium arsenide, and two pairs of 60 Angstroms thick gallium arsenide antimonide and 300 Angstrom thick gallium arsenide interposed between both the first and second, and second and third of the three layers.

Finally the sixth section of the stack includes eleven pairs, alternately layers of 2280 Angstroms thick silicon dioxide and 1470 Angstrom thick layers of titanium dioxide. Alternatively, tantalum oxide zinc sulfide or zinc selenide may be substituted for the titanium dioxide.

There are expected to be a variety of other materials systems that should operate similarly to the particular material system of the exemplary embodiment described. In particular, it should be feasible to use materials that provide short wavelength pumping light in the range of between 0.6 and 1.6 microns and long-wavelength output light of between 0.9 micron and 1.7 microns.

What is claimed:

1. A vertical cavity surface emitting laser emitting light at a first wavelength longer than a second wavelength of the light used for optically pumping it comprising
   a substrate supporting a stack of layers, the stack comprising in turn:
   a first section forming a first mirror highly reflective of the light of the second wavelength;
   a second section forming the cavity of a laser emitting at the second wavelength and including the gain medium of the laser;
   a third section forming a second mirror reflective of the light of the second wavelength and partially transmissive of light of said second wavelength, the first, second, and third sections forming a vertical cavity surface emitting laser emitting at the second wavelength;
   a fourth section forming a mirror highly reflective of the first wavelength and transmissive to light of the second wavelength;
   a fifth section forming the cavity of the laser emitting at the first wavelength and including the gain medium of such laser; and
   a sixth section forming a mirror reflective of the first and second wavelengths and partially transmissive of light of the first wavelength, characterized in that the third and sixth sections are spaced to establish a standing wave of the second wavelength therebetween and that the first, second, third, fourth, and fifth sections are epitaxial with the substrate.

2. The vertical cavity surface emitting laser of claim 1 in which the gain medium of the fifth section comprises a plurality of quantum wells.

3. The vertical cavity surface emitting laser of claim 1 in which the first wavelength is in the range between 0.9 micron and 1.7 microns and the second wavelength is in the range of between 0.6 and 1.6 microns.

4. The vertical cavity surface emitting laser of claim 1 in which the first wavelength is in the range between 1.2 and 1.4 microns and the second wavelength is in the range between 0.8 and 1.0 microns.

5. The vertical cavity surface emitting laser of claim 4 in which the substrate is gallium arsenide, the first section comprises a distributed Bragg reflective mirror formed of alternate layers of aluminum arsenide and aluminum gallium arsenide, the second section comprises a p-i-n diode including quantum wells for providing the gain medium, the third section comprises a distributed Bragg reflective mirror formed of alternate layers of aluminum arsenide and aluminum gallium arsenide that is more than one per cent transmissive, the fourth section comprises a distributed Bragg reflective mirror of aluminum arsenide and gallium arsenide, the fifth section comprises layers of aluminum gallium arsenide and interposed dual layers of gallium arsenide antimonide and gallium arsenide, and the sixth section comprises alternately layers of silicon oxide and a material chosen from the group consisting of titanium oxide, tantalum oxide, zinc sulfide and zinc selenide.

6. The vertical cavity surface emitting laser of claim 4 in which the substrate is gallium arsenide, the first section comprises alternately layers of aluminum arsenide and aluminum gallium arsenide; the second section comprises a doped layer of aluminum gallium arsenide, alternating pairs of undoped gallium arsenide and undoped aluminum gallium arsenide, and a layer of doped gallium aluminum arsenide; the third section comprises alternately layers of aluminum gallium arsenide and aluminum arsenide; the fourth section comprises alternately layers of aluminum arsenide and gallium arsenide; the fifth section comprises layers of aluminum gallium arsenide interposed with dual layers of gallium arsenide antimonide and gallium arsenide; and the sixth section comprises alternately layers of silicon oxide and titanium oxide.

* * * * *